United States Patent
Kubota et al.

(10) Patent No.: US 8,184,241 B2
(45) Date of Patent: May 22, 2012

(54) LIQUID CRYSTAL DISPLAY DEVICE

(75) Inventors: Hidenao Kubota, Mobara (JP);
Takahiro Yamada, Mobara (JP)

(73) Assignees: Hitachi Displays, Ltd., Chiba-ken (JP);
Panasonic Liquid Crystal Display Co., Ltd., Hyogo-Ken (JP)

( * ) Notice: Subject to any disclaimer, the term of this patent is extended or adjusted under 35 U.S.C. 154(b) by 434 days.

(21) Appl. No.: 12/213,852

(22) Filed: Jun. 25, 2008

(65) Prior Publication Data

US 2009/0002607 A1   Jan. 1, 2009

(30) Foreign Application Priority Data

Jun. 29, 2007 (JP) ................. 2007-171665

(51) Int. Cl.
*G02F 1/136* (2006.01)
*G02F 1/1333* (2006.01)
*G02F 1/1335* (2006.01)
*C09K 19/00* (2006.01)

(52) U.S. Cl. ........... 349/96; 349/42; 349/106; 349/122; 349/138; 349/159; 428/1.5

(58) Field of Classification Search .............. 349/96, 349/122, 138, 159, 42, 106; 428/1.5
See application file for complete search history.

(56) References Cited

U.S. PATENT DOCUMENTS

| | | | | |
|---|---|---|---|---|
| 4,352,961 A | * | 10/1982 | Kumada et al. | 455/350 |
| 5,492,582 A | * | 2/1996 | Ide et al. | 156/106 |
| 6,023,316 A | * | 2/2000 | Yano | 349/112 |
| 6,204,899 B1 | * | 3/2001 | Hall | 349/65 |
| 2001/0005256 A1 | * | 6/2001 | Sumi et al. | 349/158 |
| 2003/0117543 A1 | * | 6/2003 | Chang | 349/58 |
| 2005/0083450 A1 | * | 4/2005 | Motomura et al. | 349/96 |
| 2005/0190320 A1 | * | 9/2005 | Yang | 349/96 |
| 2009/0086150 A1 | | 4/2009 | Koyama et al. | |

FOREIGN PATENT DOCUMENTS

| | | |
|---|---|---|
| JP | 11-174417 | 7/1999 |
| WO | WO 2007/007543 | 1/2007 |

* cited by examiner

*Primary Examiner* — Mark Robinson
*Assistant Examiner* — Jerry Blevins
(74) *Attorney, Agent, or Firm* — Stites & Harbison, PLLC; Juan Carlos A. Marquez, Esq.

(57) ABSTRACT

The present invention mechanically protects a surface of a miniaturized liquid crystal display device for mobile phone or the like without deteriorating image quality and without increasing a thickness of a whole display device. To achieve such an object, in the present invention, a liquid crystal display panel is constituted of a TFT substrate and a color filter substrate, a lower polarizer is adhered to a lower surface of the TFT substrate, and an upper polarizer is adhered to an upper surface of the color filter substrate. A face plate is adhered to the upper polarizer using an acrylic adhesive material which is cured by ultraviolet rays. For enhancing strength and adhesion property of the face plate, corners and side portions of the face plate are chamfered. By making a profile of the face plate smaller than a profile of the upper polarizer, the adhesion property of the face plate is enhanced. The present invention can protect the surface of the liquid crystal display panel without deteriorating image quality and without largely increasing a thickness of the display device.

1 Claim, 10 Drawing Sheets

LIQUID CRYSTAL DISPLAY DEVICE

CROSS-REFERENCE TO RELATED APPLICATIONS

The disclosure of Japanese Patent Application No. 2007-171665 filed on Jun. 29, 2007 including the specification, drawings and abstract is incorporated herein by reference in its entirety.

BACKGROUND OF THE INVENTION

1. Field of the Invention

The present invention relates to a liquid crystal display device, and more particularly to a technique which enhances strength and visibility of a miniaturized display device used in a mobile phone or the like.

2. Description of the Related Art

With respect to a liquid crystal display device, there has been a strong demand for the reduction of a thickness of a liquid crystal display panel along with a demand for the reduction of a profile size of a set while maintaining a screen at a fixed size. To decrease the thickness of the liquid crystal display panel, after manufacturing the liquid crystal display panel, an outer side of the liquid crystal display panel is polished to decrease the thickness of the liquid crystal display panel.

The liquid crystal display device is constituted of a TFT substrate which forms pixel electrodes, TFTs and the like thereon or a color filter substrate which forms color filters thereon. A glass substrate which is served for forming the TFT substrate and the color filter substrate has a thickness thereof standardized to 0.5 mm or to 0.7 mm. It is difficult to acquire such standardized glass substrate from a market. Further, an extremely thin glass substrate gives rise to drawbacks on mechanical strength, deflection or the like in manufacturing steps thereof thus lowering a manufacturing yield rate. As a result, after forming the liquid crystal display panel using the standardized glass substrate, an outer surface of the liquid crystal display panel is polished to decrease the thickness of the liquid crystal display panel.

The reduction of the thickness of the liquid crystal display panel gives rise to a drawback on mechanical strength. That is, there exists a possibility that the liquid crystal display panel is broken when mechanical pressure is applied to a display screen of the liquid crystal display panel. To prevent such breaking of the liquid crystal display panel, as shown in FIG. 10, in assembling the liquid crystal display panel in a set such as a mobile phone, a front window (hereinafter referred to as face plate) is mounted on a screen side of the liquid crystal display panel. The face plate is usually formed larger than the color filter substrate.

To prevent the application of a force to the liquid crystal display panel when an external force is applied to the face plate, the face plate is arranged in a spaced-apart manner from the liquid crystal display panel. However, the constitution shown in FIG. 10 gives rise to a drawback that display quality is deteriorated as described later. Japanese Patent Laid-Open Hei11-174417 (patent document 1) discloses a technique which copes with the drawback attributed to the structure shown in FIG. 10, for example.

SUMMARY OF THE INVENTION

The related art shown in FIG. 10 gives rise to a drawback that an image appears as a duplicate image. FIG. 10 is a view explaining the drawback by taking a reflective liquid crystal display panel as an example. In FIG. 10, an incident external light L passes a face plate, is reflected on the liquid crystal display panel, passes the face plate again, and enters human eyes. Here, although the external light L is refracted on the face plate, the refraction is ignored in FIG. 10.

A portion of light reflected on a screen P1 of the liquid crystal display panel is reflected on a lower surface Q1 of the face plate, is incident on a screen P2 of the liquid crystal display panel, and is reflected on the screen P2 of the liquid crystal display panel. When a viewer recognizes light reflected on the screen P2 with his/her eyes, a phenomenon that an image appears as a duplicate image occurs. Although the explanation has been made by taking the reflective liquid crystal display panel as an example in FIG. 10, the same goes for a transmissive liquid crystal display panel. That is, in the transmissive liquid crystal display panel, when light passes the liquid crystal display panel at an angle equal to an angle of reflection light on a screen P1 each of the liquid crystal display panel, light is reflected on a lower surface Q1 of a face plate, and traces a path in the same manner as a path of the reflective liquid crystal display panel. The phenomenon which makes the image appear as a duplicate image deteriorates image quality.

In the technique described in patent document 1, for example, which copes with such a drawback, an adhesive resilient body is arranged between the face plate and the liquid crystal display panel. The adhesive resilient body protects the liquid crystal display panel from an external force. Further, by setting reflectance of the adhesive resilient body to a value close to reflectance of the face plate, the reflection on an interface with the face plate can be suppressed. However, the technique disclosed in patent document 1 requires the uniform adhesion of the face plate eliminating the presence of bubbles or the like between the face plate and the adhesive resilient body and hence, it is extremely difficult to apply the technique to the mass production of the liquid crystal display panels. Further, there arises a drawback in selecting a material which can approximate the reflectance of the adhesive resilient body to the reflectance of the face plate. In addition to these drawbacks, since the adhesive resilient body requires considerable thickness, the technique disclosed in patent document 1 cannot completely overcome the drawback that the image appears as the duplicate image.

The present invention has been made to overcome the above-mentioned drawbacks of the related art, and the specific constitutions of the present invention are as follows.

(1) The present invention is directed to a liquid crystal display device including a liquid crystal display panel which has a TFT substrate on which pixel electrodes and TFTs for controlling signals to the pixel electrodes are arranged in a matrix array and a color filter substrate on which color filters corresponding to the pixel electrodes are formed, wherein an upper polarizer is adhered to the color filter substrate, a face plate made of glass is adhered to the upper polarizer, and the upper polarizer and the face plate are adhered to each other using a ultraviolet curing resin.

(2) The liquid crystal display device described in the constitution (1) is characterized in that the ultraviolet curing resin is a liquid containing an acrylic resin at the time of initially adhering the face plate and the upper polarizer adhered to the liquid crystal display panel.

(3) The liquid crystal display device described in the constitution (1) is characterized in that the ultraviolet curing resin is a liquid containing an acrylic oligomer at the time of initially adhering the face plate and the upper polarizer adhered to the liquid crystal display panel.

(4) The present invention is also directed to a liquid crystal display device including a liquid crystal display panel which has a TFT substrate on which pixel electrodes and TFTs for controlling signals to the pixel electrodes are arranged in a matrix array and a color filter substrate on which color filters corresponding to the pixel electrodes are formed, wherein an upper polarizer is adhered to the color filter substrate, a face plate made of glass is adhered to the upper polarizer, and a corner portion of the face plate is chamfered with a cutting size of 0.3 mm or more.

(5) The liquid crystal display device described in the constitution (4) is characterized in that the corner portion of the face plate is chamfered with a cutting size of 0.5 mm or more.

(6) The liquid crystal display device described in the constitution (4) is characterized in that a side portion of the face plate is chamfered with a cutting size of 0.05 mm or more.

(7) The liquid crystal display device described in the constitution (4) is characterized in that the side portion of the face plate is chamfered with a cutting size of 0.15 mm or more.

(8) The present invention is also directed to a liquid crystal display device including a liquid crystal display panel which has a TFT substrate on which pixel electrodes and TFTs for controlling signals to the pixel electrodes are arranged in a matrix array and a color filter substrate on which color filters corresponding to the pixel electrodes are formed, wherein an upper polarizer is adhered to the color filter substrate, a face plate made of glass is adhered to the upper polarizer, and a corner portion of the face plate is rounded with a corner radius R of 0.3 mm or more.

(9) The liquid crystal display device described in the constitution (8) is characterized in that the corner portion of the face plate is rounded with a corner radius R of 0.5 mm or more.

(10) The liquid crystal display device described in the constitution (8) is characterized in that a side portion of the face plate is chamfered with a cutting size of 0.05 mm or more.

(11) The liquid crystal display device described in the constitution (8) is characterized in that the side portion of the face plate is chamfered with a cutting size of 0.15 mm or more.

(12) The present invention is also directed to a liquid crystal display device including a liquid crystal display panel which has a TFT substrate on which pixel electrodes and TFTs for controlling signals to the pixel electrodes are arranged in a matrix array and a color filter substrate on which color filters corresponding to the pixel electrodes are formed, wherein an upper polarizer is adhered to the color filter substrate, a face plate made of glass is adhered to the upper polarizer, and the face plate has a profile smaller than a profile of the upper polarizer.

(13) The liquid crystal display device described in the constitution (12) is characterized in that the upper polarizer and the face plate have an approximately rectangular shape, and the face plate is shorter than the upper polarizer by 0.5 mm or more with respect to a short-axis length and a long-axis length.

(14) The liquid crystal display device described in the constitution (12) is characterized in that the corner portion of the face plate is chamfered with a cutting size of 0.3 mm or more.

(15) The liquid crystal display device described in the constitution (12) is characterized in that the corner portion of the face plate is rounded with a corner radius R of 0.3 mm or more.

According to the present invention, the face plate made of glass can be adhered to the liquid crystal display panel and hence, the deterioration of image quality attributed to the interface reflection between the face plate and the liquid crystal display panel can be largely reduced. That is, in initially adhering the face plate to the liquid crystal display panel, that is, before the adhesive material is cured by ultraviolet rays, the adhesive material is in a liquid state and hence, it is possible to uniformly adhere the face plate to the liquid crystal display panel.

Further, according to the present invention, the glass face plate can be used and hence, the face plate exhibits high surface hardness whereby the deterioration of image quality attributed to flaws on the face plate or the like can be largely reduced. Further, by adhering the glass face plate to the liquid crystal display panel using the adhesive material, the thickness of the whole liquid crystal display device can be set smaller than the whole thickness of the conventional liquid crystal display device.

Since proper chamfered portion or rounded portion is formed on a corner portion of the face plate according to the present invention and hence, the strength of the face plate can be increased and, at the same time, a phenomenon that the face plate is peeled off at the corner portion can be prevented.

In addition to the above-mentioned advantageous effects, chamfering is applied to all sides of the face plate according to the present invention and hence, strength of the face plate can be enhanced and, at the same time, white dot defect attributed to burrs on the side portions of the face plate can be prevented.

Further, the face plate according to the present invention is smaller than the upper polarizer in size and hence, the generation of bubbles at the time of adhering the face plate to the upper polarizer can be suppressed thus allowing the face plate to be uniformly adhered to the liquid crystal display panel.

According to the present invention, by adopting the above-mentioned constitutions, the direct adhesion of the glass face plate to the liquid crystal display panel which has been impossible conventionally can be realized.

DESCRIPTION OF THE PREFERRED EMBODIMENT

The present invention is explained in detail in conjunction with embodiments.

Embodiment 1

Figure 1:
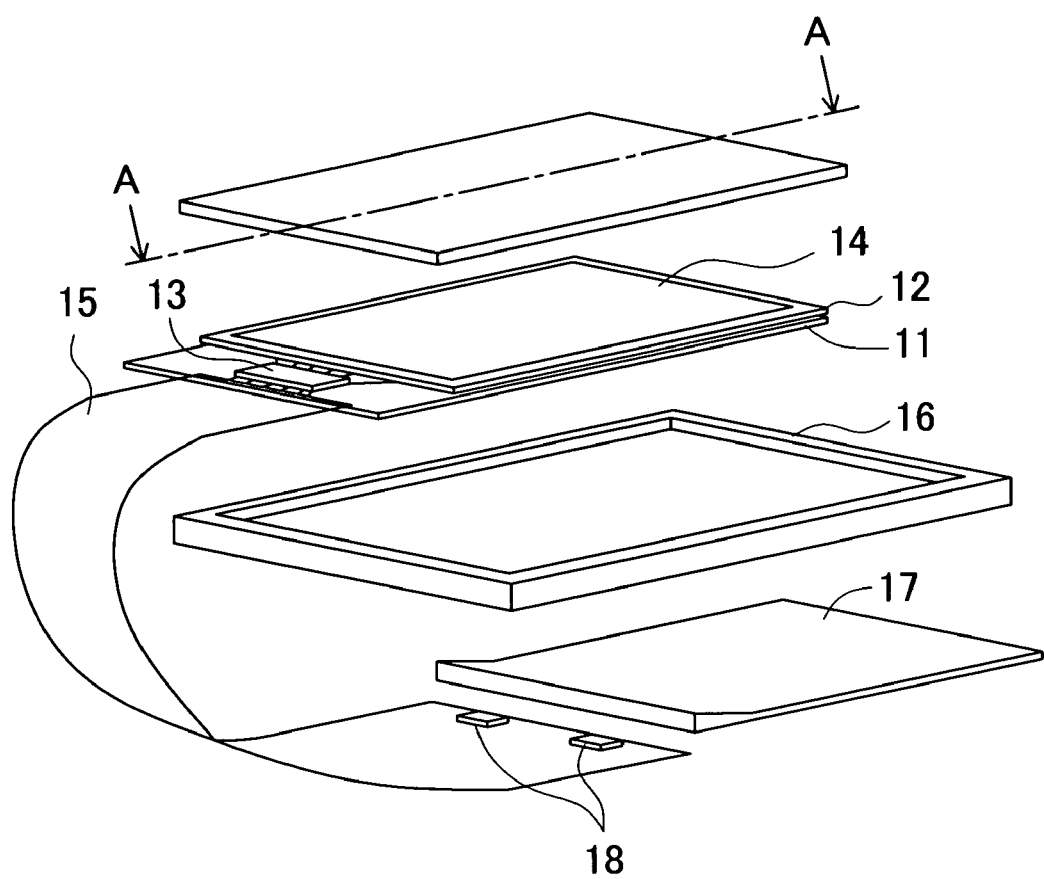
FIG. 1 is an exploded perspective view of a liquid crystal display device to which the present invention is applied.
Figure 2:
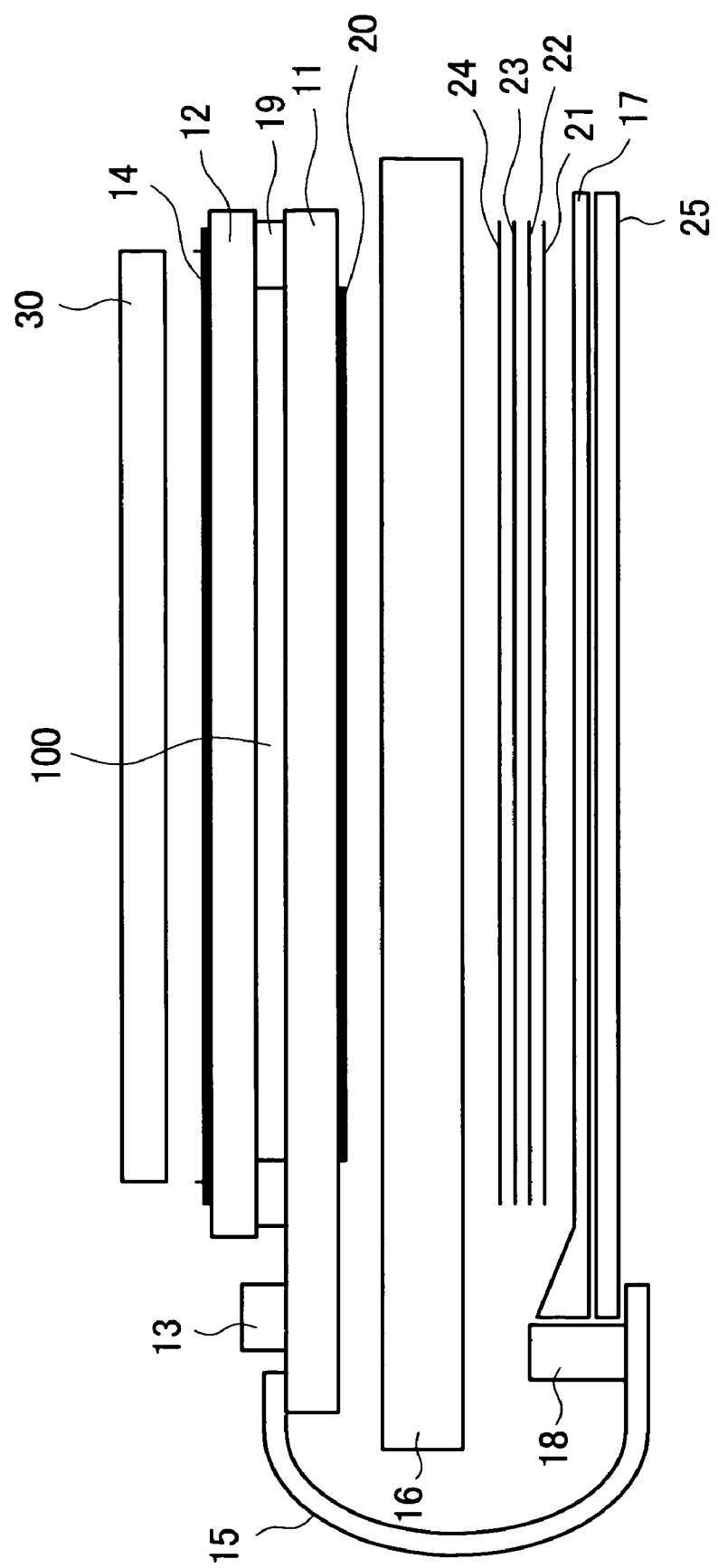
FIG. 2 is a cross-sectional view taken along a line A-A in FIG. 1.

FIG. 1 is an exploded perspective view showing a liquid crystal display device of an embodiment 1 according to the present invention. FIG. 2 is an exploded cross-sectional view taken along a line A-A in FIG. 1. In FIG. 1, a liquid crystal display panel is constituted of a TFT substrate 11 and a color filter substrate 12. Pixel electrodes are formed on the TFT substrate 11 in a matrix array. TFTs (Thin Film Transistors) for changing over a signal supplied to respective pixel electrodes are also formed on the TFT substrate 11. The color filter substrate 12 which forms color filters thereon is arranged to face the TFT substrate 11 in an opposed manner.

Respective thicknesses of glass substrates used in the manufacture of the TFT substrate 11 and the color filter substrate 12 are set to 0.5 mm. After completion of manufacturing of the liquid crystal display panel by filling and sealing liquid crystal between the substrates, outer sides of the liquid crystal display panel are polished so as to reduce a thickness of the whole liquid crystal display panel. In this embodiment, a thickness of the liquid crystal display panel after polishing is approximately 0.6 mm. That is, the thicknesses of the respective glass substrates are decreased by 0.2 mm by polishing.

The TFT substrate 11 is larger than the color filter substrate 12 in size, and a drive IC 13 and a flexible printed circuit board 15 are mounted on a portion of the TFT substrate 11 where the color filter substrate 12 does not overlap with the TFT substrate 11. The liquid crystal display panel is housed in a resin mold 16 so that the liquid crystal display panel is mechanically protected. Although a portion of the liquid crystal display panel where the TFT substrate 11 and the color filter substrate 12 overlap with each other is mechanically strong, a portion of the liquid crystal display panel which is constituted of only the TFT substrate 11 is mechanically weak. Accordingly, the liquid crystal display panel adopts the mold 16 structure for preventing an impact from being applied to such a mechanically weak portion.

A backlight is arranged below the mold 16. In FIG. 1, among components of the backlight, only a light guide plate 17 is shown. The flexible printed circuit board 15 is routed to a back side of the mold 16, and is arranged below the backlight. LEDs 18 (Light Emitting Diode) which constitute a light source of the backlight are mounted on the flexible printed circuit board 15, and are arranged on a side surface of the light guide plate 17. On the flexible printed circuit board 15, not only the LEDs 18 and a power source for the LEDs 18, but also a power source for driving the liquid crystal display panel, lines for supplying signals to scanning lines and data signal lines and the like are arranged.

In FIG. 1, an upper polarizer 14 is mounted on an upper surface of the liquid crystal display panel. A face plate 30 is mounted on the upper polarizer 14. The face plate 30 is made of glass and has a thickness of 0.95 mm. Due to the formation of the face plate 30 using reinforced glass along with the possession of such a thickness larger than the thickness of the liquid crystal display panel, the face plate 30 has the sufficient mechanical strength for protecting the liquid crystal display panel. In addition to the above-mentioned advantageous effects, by properly chamfering the face plate described later, the deterioration of the strength of the face plate is prevented. The face plate 30 is adhered to the liquid crystal display panel, to be more specific, to the upper polarizer 14 using an acrylic adhesive material 31.

FIG. 2 is a cross-sectional view taken along a line A-A in FIG. 1 and also is an exploded cross-sectional view. In the actual structure, the liquid crystal display panel and the backlight are housed in the inside of the mold 16. The face plate 30 is adhered to the liquid crystal display panel. In FIG. 2, the TFT substrate 11 and the color filter substrate 12 are arranged with a gap of several μm therebetween, and the liquid crystal is sandwiched between the TFT substrate 11 and the color filter substrate 12. A sealing material 19 is arranged on peripheries of the TFT substrate 11 and the color filter substrate 12 and the liquid crystal is sealed inside the sealing material 19.

On the TFT substrate 11, in addition to the pixel electrodes and the TFTs, scanning lines, data signal lines and the like are arranged. These lines extend to the outside after penetrating the sealing material 19, and are connected to a drive IC 13 or a flexible printed circuit board 15. The flexible printed circuit board 15 extends to a position behind the backlight. The LEDs 18 mounted on the flexible printed circuit board 15 are arranged on a side surface of the light guide plate 17 and constitute the light source of the backlight. A plurality of LEDs 18 is mounted on the flexible printed circuit board 15.

In FIG. 2, the light guide plate 17 plays a role of directing the light from the LEDs 18 arranged on the side surface thereof toward a liquid-crystal-display-panel side. A reflection sheet 25 is provided for directing the light which advances downwardly from the light guide plate 17 toward the liquid-crystal-display-panel side. A lower diffusion sheet 21 is arranged on the light guide plate 17. Although the plurality of LEDs 18 is arranged on the side surface of the light guide plate 17, a gap exists between the LEDs 18 and the side surface of the light guide plate 17 and hence, light which advances upwardly from the light guide plate 17 becomes non-uniform. That is, a portion of the light guide plate 17 in the vicinity of the LEDs 18 becomes brighter than other portions of the light guide plate 17. The lower diffusion sheet 21 is provided to cope with such non-uniformity of light and plays a role of making the light advancing upwardly from the light guide plate 17 uniform.

A lower prism sheet 22 is arranged on the lower diffusion sheet 21. A large number of prisms which extends in the lateral direction of a screen is formed on the lower prism sheet 22 at fixed intervals, for example, at intervals of approximately 50 μm. Due to such prisms, light which is emitted from the light guide plate 17 focuses the light which tends to spread in the longitudinal direction of the screen in the direction perpendicular to the liquid crystal display panel. An upper prism sheet 23 is arranged on the lower prism sheet 22. A large number of prisms which extends in the direction orthogonal to the prisms formed on the lower prism sheet 22, that is, in the longitudinal direction of the screen, is formed on the upper prism sheet 23 at fixed intervals, for example, at intervals of approximately 50 μm. Due to such prisms, light which is emitted from the light guide plate 17 focuses the light which tends to spread in the lateral direction of the screen in the direction perpendicular to the liquid crystal display panel. In this manner, with the use of the lower prism sheet 22 and the upper prism sheet 23, it is possible to focus the light which tends to spread in the longitudinal direction as well as in the lateral direction of the screen in the direction perpendicular to the screen. That is, with the use of the lower prism sheet 22 and the upper prism sheet 23, it is possible to increase the front brightness.

An upper diffusion sheet 24 is arranged on the upper prism sheet 23. The prisms which extend in the fixed direction are arranged on the prism sheets at intervals of 50 μm, for example. That is, bright and dark stripes are formed at intervals of 50 μm. On the other hand, on the liquid crystal display panel, scanning lines are formed in the lateral direction of the screen at fixed intervals, and data signal lines are formed in the longitudinal direction of the screen at fixed intervals. Accordingly, the interference occurs between the scanning lines and the lower prism sheet 22 or between the data signal lines and the upper prism sheet 23 thus generating moiré. The upper diffusion sheet 24 plays a role of reducing this moiré by making use of a diffusion effect.

The light which passes through the upper diffusion sheet is incident on the lower polarizer 20 which is adhered to the liquid crystal display panel and hence, the light is polarized. Transmissivity of the polarized light is controlled by the liquid crystal for every pixel in the inside of the liquid crystal display panel so as to form an image. The light which passes through the liquid crystal display panel is polarized again by the upper polarizer 14 and a viewer recognizes the light with his/her naked eyes.

Figure 3:
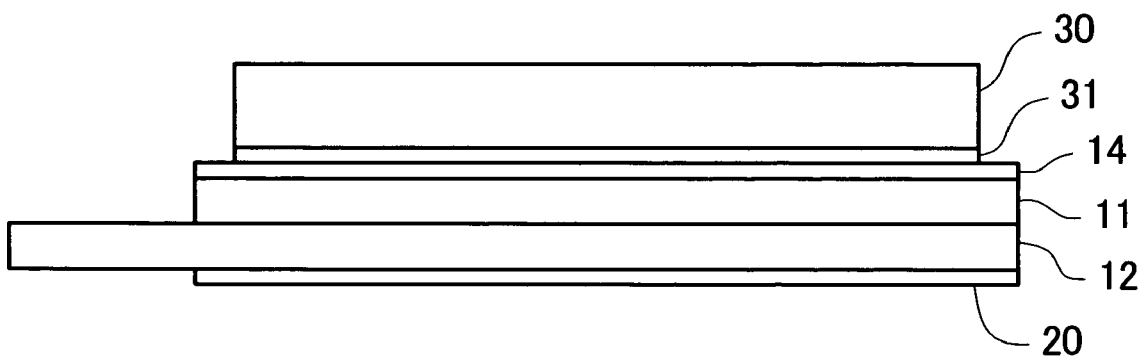
FIG. 3 is a view showing a state that a face plate is mounted on a liquid crystal display panel.

The face plate 30 is arranged on the upper polarizer 14. The face plate 30 according to the present invention is made of glass. Glass exhibits high hardness and hence, the face plate 30 made of glass can prevent flaws or the like formed on a front surface of the face plate 30 compared to the face plate 30 made of plastic or the like. The face plate 30 is adhered to the upper polarizer 14 using an adhesive material 31. FIG. 3 shows a state after the face plate 30 is adhered to the upper polarizer 14. A thickness of the face plate 30 is 0.95 mm. Compared to a thickness of the whole liquid crystal display panel including the TFT substrate 11 and the color filter substrate 12 which is 0.6 mm, the thickness of the face plate 30 is set considerably large. Further, reinforcing treatment is applied to the face plate 30 and hence, the face plate 30 exhibits the strength considerably higher than the strength of the liquid crystal display panel. Accordingly, it is possible to sufficiently enhance a mechanical protection effect. In addition to the above-mentioned advantageous effects, as described later, the face plate is suitably chamfered at the corner portions and the side portions thereof thus preventing the deterioration of the strength of the face plate.

The face plate 30 is smaller than the upper polarizer 14 in size. It is preferable to set both of a short-axis length and a long-axis length of the face plate 30 shorter than a short-axis length and a long-axis length of the upper polarizer 14 by 0.5 mm or more respectively. Conventionally, the face plate 30 is arranged in a spaced-apart manner from the liquid crystal display panel with a gap therebetween. One of the reasons is that when the liquid crystal display panel and the face plate 30 are adhered to each other, the uniform adhesion cannot be acquired due to the intrusion of bubbles or the like. According to the present invention, by making the size of the face plate 30 smaller than the size of the polarizer, the probability of the intrusion of bubbles or the like at the time of adhering the face plate 30 to the liquid crystal display panel can be extremely lowered thus realizing the adhesion of the face plate 30 to the liquid crystal display panel in practice use.

Further, according to the present invention, by specifying a material of the adhesive material 31 used for adhering the face plate 30 to the liquid crystal display panel, the face plate 30 can be uniformly adhered to the liquid crystal display panel. That is, when the face plate 30 is adhered to the upper polarizer 14 of the liquid crystal display panel, the adhesive material 31 is in a liquid state. At the time of initially adhering the upper polarizer and the face plate to each other, the adhesive material is in a liquid state and hence, even when there exists a slight gap between the face plate 30 and the upper polarizer 14, the gap is easily filled with the liquid. Accordingly, it is possible to prevent the intrusion of the bubbles.

Figure 10:
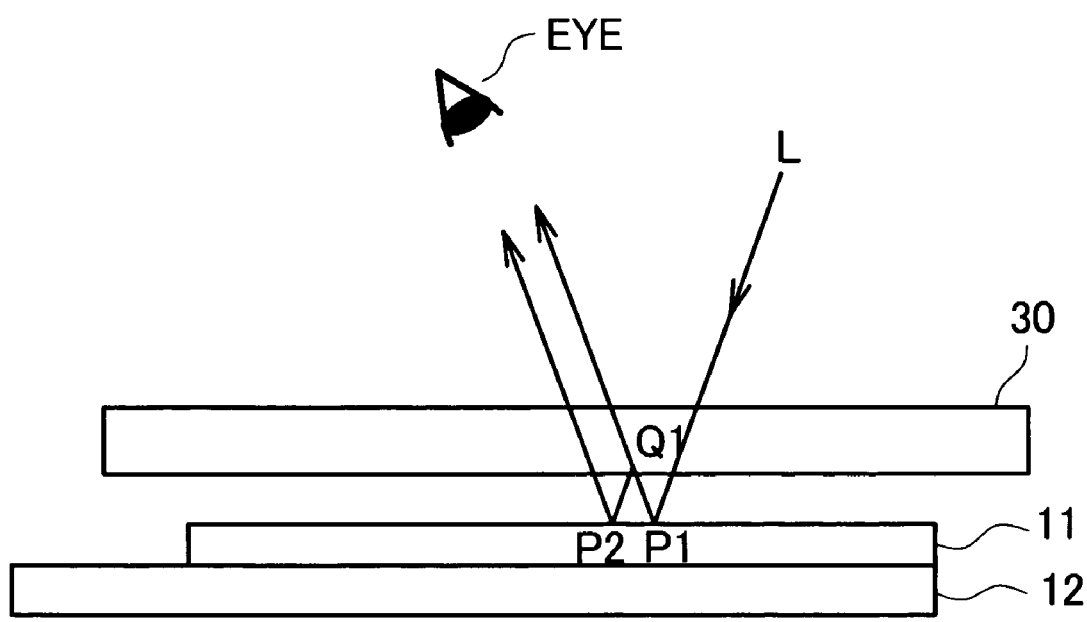
FIG. 10 is a view showing the relationship between a face plate and a liquid crystal display panel of the related art.

By radiating ultraviolet rays to the adhesive material 31 which is in a liquid state initially, the adhesive material 31 is cured so that the face plate 30 is fixed to the liquid crystal display panel. Due to such a process, it is possible to uniformly adhere the face plate 30 to the liquid crystal display panel. As the adhesive material 31 which is initially in a liquid state, for example, an acrylic resin which contains 27% to 30% of acrylic oligomer, UV-reactive monomer, an additive for photo-polymerization and the like can be used. A thickness of the adhesive material 31 after curing is several μm and hence, it is possible to prevent a phenomenon that an image appears as a duplicate image described in conjunction with FIG. 10 as a conventional example.

Figure 4A:
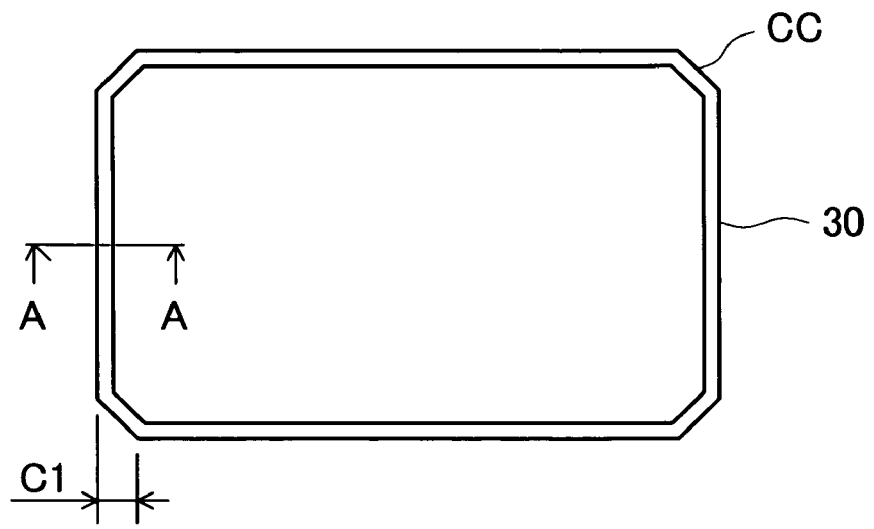
FIG. 4A to FIG. 4C are views showing a profile of the face plate of an embodiment 1.
Figure 4B:
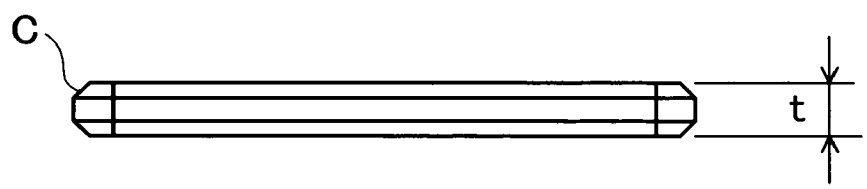
Figure 4C:
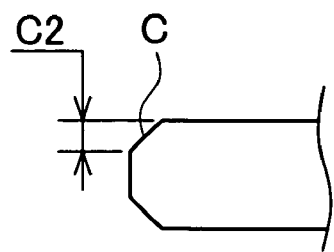

FIG. 4A to FIG. 4C show a shape of the face plate 30. The face plate 30 is provided for mechanically protecting the liquid crystal display panel and hence, the face plate 30 per se is required to be mechanically strong. The thickness t of the face plate 30 is set to 0.95 mm and reinforced glass is used as glass so as to increase the strength of the face plate 30. However, to impart the sufficient strength to the face plate 30, it is important to take a shape of the face plate 30 into consideration besides the material and the thickness of the face plate 30. A particularly important point lies in a chamfer CC of corner portions and a chamfer C on side portions shown in FIG. 4A to FIG. 4C.

In FIG. 4A to FIG. 4C, the chamfer CC is formed on each corner portions. The chamfer CC is a portion which is formed by removing a sharp corner portion by shaving the corner of the glass substrate having a rectangular shape. In this embodiment, the face plate 30 is chamfered simultaneously with the formation of an accurate profile of the face plate 30 by polishing peripheries of the face plate 30. A value C1 which determines the shape of the chamfer CC is 0.5 mm. The value C1 may preferably be set to 0.5 mm or more. However, when the value C1 is set to 0.3 mm or more, it is possible to acquire the advantageous effect. On the other hand, a profile of the face plate 30 is formed smaller than a profile of the upper polarizer 14 and hence, when the value C1 is excessively increased, the chamfer CC extends over a display region of the liquid crystal display panel. Accordingly, the value C1 is usually set to 3 mm or less. Another significant advantageous effect acquired by the formation of the chamfers CC lies in that, by forming the chamfers on the face plate 30, the face plate 30 is hardly peeled off from the liquid crystal display panel. According to an experiment, peeling-off of the face plate 30 from the liquid crystal display panel starts from the corner portion of the face plate 30. Accordingly, by chamfering the corner portions of the face plate 30, it is possible to prevent the peeling-off of the face plate 30.

With respect to the strength of the face plate 30, the next important point is the formation of the chamfer C on side portions shown in FIG. 4A to FIG. 4C. All sides of the face plate 30 are chamfered. Burrs are liable to be formed on the side portion, and when burrs are generated in such a portion, the generated burrs may cause cracks. In this embodiment, a value C1 indicative of a size of the chamfer shown in FIG. 4C is set to 0.15 mm. The chamfer on the side portion may preferably be set to 0.15 mm or more. However, when the value C1 is set to 0.05 mm or more, it is possible to acquire the advantageous effect. On the other hand, an upper limit of a value C2 of the chamfer C is determined based on the relationship between the thickness of the face plate 30 and the display region. When the thickness of the face plate 30 is set to 0.95 mm as in the case of this embodiment, the upper limit of the value C2 is set to approximately 0.3 mm.

Further, in view of the relationship that the face plate 30 is smaller than the upper polarizer 14 in size, when the value C2 of the chamfer C is increased, the chamfered portions extend over the display region. Accordingly, the upper limit of the value C2 varies based on the thickness of the face plate 30, a size of a screen or the like. The formation of the chamfers C also exhibits an advantageous effect in view of not only the strength of the glass but also image quality. That is, when the face plate 30 is not chamfered, burrs are liable to be formed on the side portion. These burrs are visually recognized as white dots in the periphery of the display screen, and these dots are counted as one of image quality defects. By suppressing the burrs by chamfering the face plate 30, it is possible to prevent the white dot defect in peripheries of the screen.

In this embodiment, IG3 (trade name and made by ISHIZUKA GLASS CO., LTD.) is used as a material of the face plate 30. This glass possesses the strength by 1.5 times as large as the strength of normal soda glass. However, manufacturing steps of the face plate 30 described later includes a process for reinforcing the glass in a chemical solution and hence, normal soda glass can be also used in this embodiment.

Figure 5:
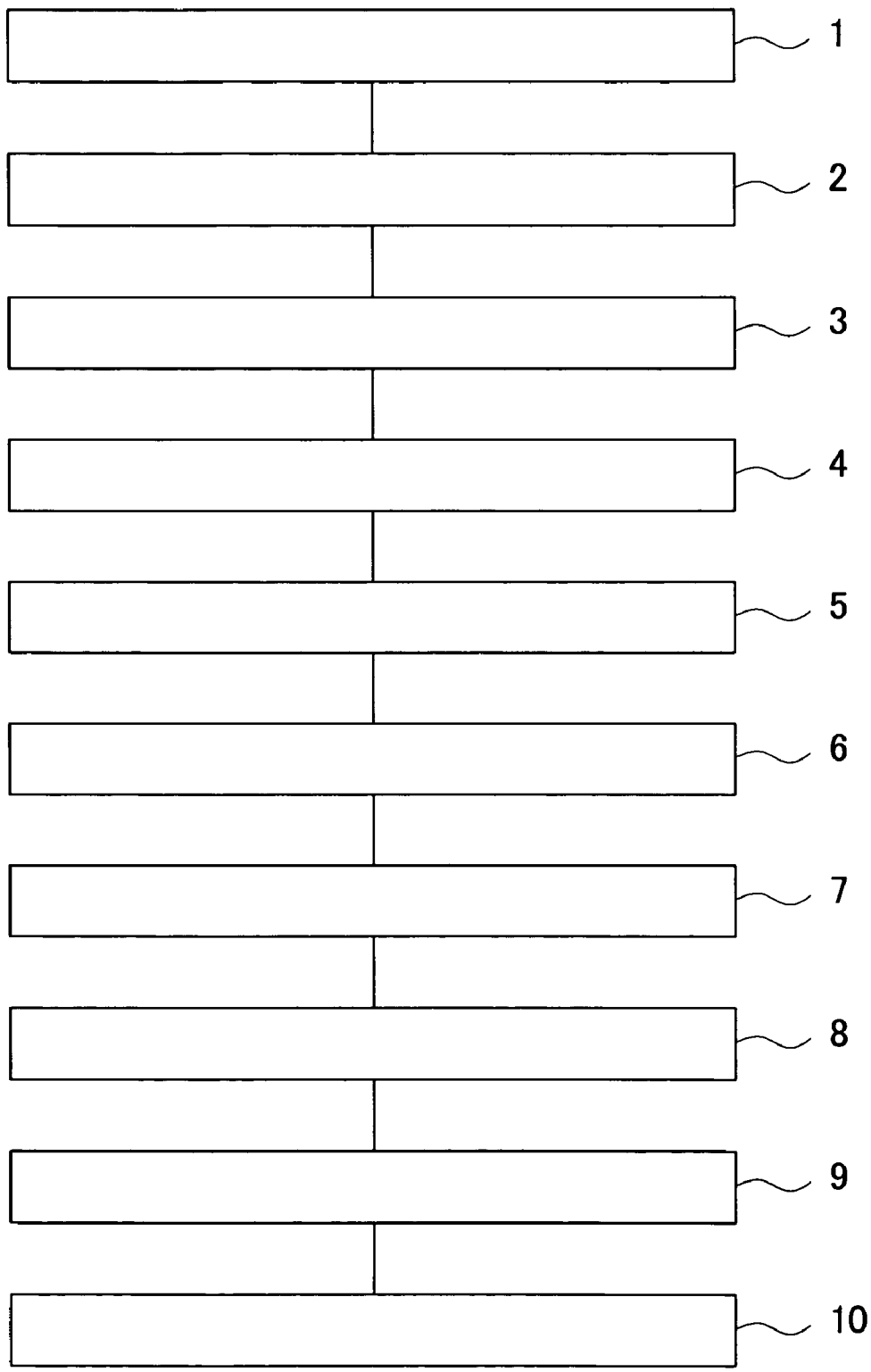
FIG. 5 is a flowchart showing manufacturing steps of the face plate.

FIG. 5 is a flowchart showing a process of manufacturing the face plate 30 shown in FIG. 4. In FIG. 5, a large number of face plates 30 are cut from a large glass substrate in step 1. Here, the face plate 30 is cut with a size slightly larger than a final size. This is because the face plate 30 is formed in an accurate size by polishing performed later. A large number of burrs are formed on the face plate 30 obtained by cutting the glass substrate in step 1. In succeeding steps, there may be a case in which the glass cracks at a portion thereof where the burr is formed. In step 2, the face plate 30 is chamfered for removing the burrs. A size of a chamfer at the time of such chamfering differs from a size of the chamfer in a final shape.

An initial thickness of the face plate 30 is 1.4 mm. In step 3, a thickness of the face plate 30 is decreased to 1.0 mm by coarse polishing. A large number of flaws or the like is formed on normal glass and hence, the normal glass is not suitable for the face plate 30 of the liquid crystal display panel when the normal glass is used as it is. Accordingly, it is necessary to make a surface of the glass uniform by polishing. After finishing coarse polishing, small polishing flaws are formed on the glass surface so that the glass exhibits a frosted glass state.

Figure 6:
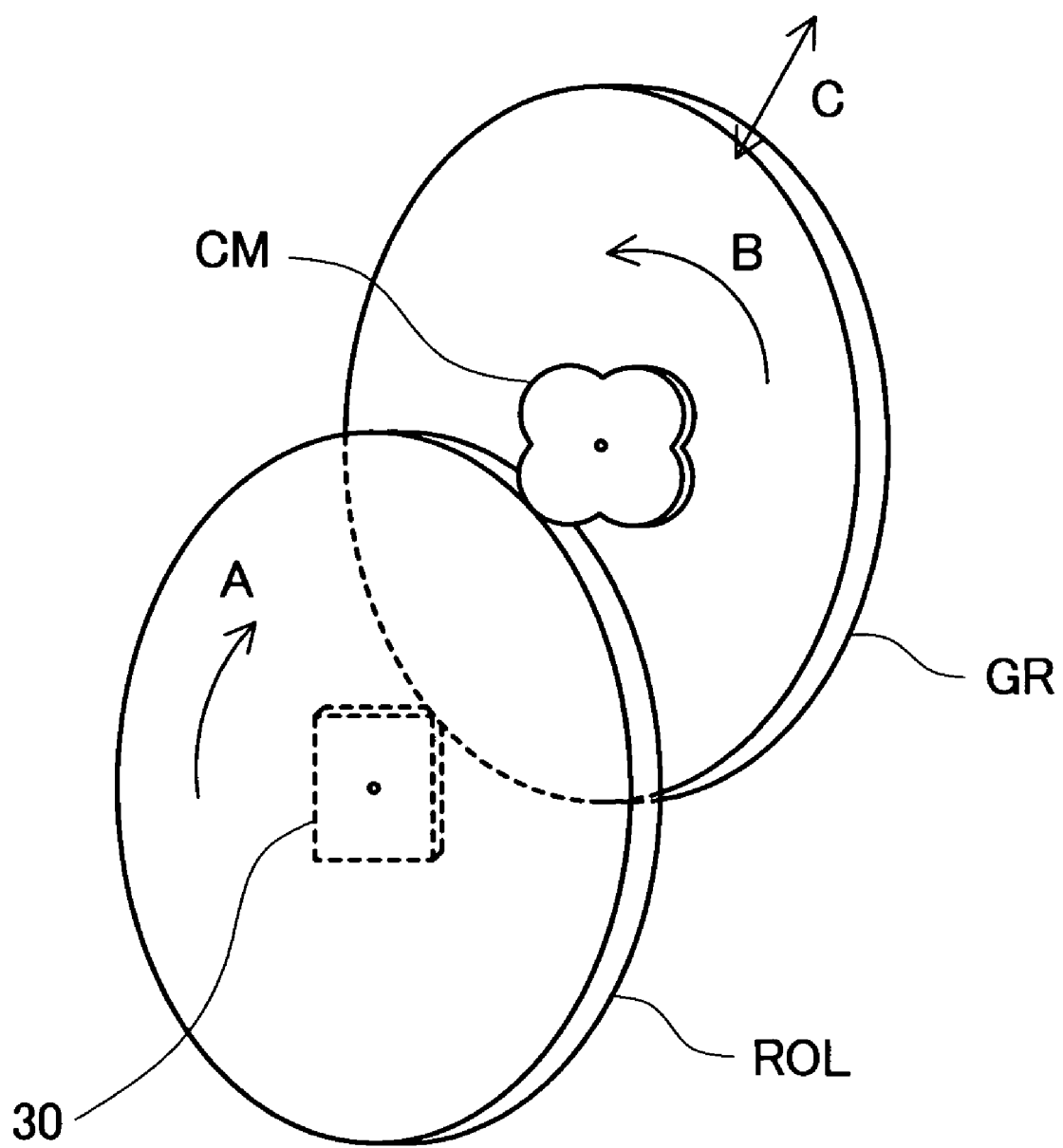
FIG. 6 is a schematic view showing a profile-polishing machine of the face plate shown in FIG. 4.

In step 4, a profile of the glass substrate is polished to bring the size of the profile into an accurate value. FIG. 6 is a schematic view showing profile polishing of the glass in step 4. In FIG. 6, a face plate 30G is mounted on a disc-like roller ROL. When the roller ROL is rotated in the direction A, the face plate 30G is also rotated in the same direction. A cam CM having a four-leaf-clover shape is coaxially mounted on a disc-like grinder GR which polishes the face plate 30. The grinder GR and the cam CM are rotated in the direction B. The grinder GR and the face plate 30 are in contact and hence, the profile of the face plate 30 is polished.

The roller ROL which rotates the face plate 30 is brought into contact with the cam CM. Accordingly, by moving the grinder GR in the direction C, an amount which the face plate 30 is shaved can be adjusted. Further, the roller ROL is moved tracing the cam CM and hence, the grinder GR can follow the profile of the rectangular face plate 30. Due to the complicated shape of the cam CM as shown in FIG. 6, it is possible to form the chamfer CC with the value C1 of 0.5 mm on the corner portion of the face plate 30. Here, as described above, when the value C1 is 0.3 mm or more, it is possible to acquire the advantageous effect. The chamfer CC formed on each corner portion of the face plate 30 is extremely important for enhancing the strength of the face plate 30 and hence, the profile of the face plate 30 is controlled by using the grinder shown in FIG. 6.

In this manner, the profile of the face plate 30 is determined and, thereafter, in step 5 shown in FIG. 5, the chamfer C is formed on the face plate 30. In step 5, in the same manner as the chamfer C in the final state, the chamfer C with the value C2 of 0.15 mm is formed on the face plate 30. As described above, when the value C2 is set to 0.05 mm or more, it is possible to acquire the advantageous effect.

Next, in step 5 shown in FIG. 5, precision polishing of the face plate 30 in the thickness direction is performed. Although the face plate 30 is polished in the thickness direction by coarse polishing in step 3, in a state after coarse polishing, a surface of the face plate 30 exhibits a frosted glass state. In step 5, the surface of the face plate 30 is polished into a transparent state by precision polishing. The surface of the face plate 30 is slightly shaved by this precision polishing and a plate thickness of the face plate 30 is decreased from 1.0 mm to 0.95 mm. That is, the face plate is polished by 0.025 mm on each side. This polishing amount is small and hence, the chamfer C formed in step 5 is not largely influenced.

Then, in step 7, a polishing agent is removed by cleaning. After cleaning, in step 8, chemical reinforcement treatment is applied to the face plate 30. The chemical reinforcement treatment is performed for chemically strengthening glass with an action of ions by immersing the face plate 30 into a chemical solution of high temperature. The chemical reinforcement treatment is performed by immersing the face plate 30 in the chemical solution at a temperature of approximately 400° C. for approximately 10 hours. Although the chemical reinforcement treatment takes time, the treatment can treat a large number of face plates 30 at a time.

After performing the chemical reinforcement treatment, the face plate 30 is cleaned by applying ultrasonic cleaning to the face plate 30 thus removing chemical substances remaining on the surface of the face plate 30. Then, the face plate 30 is wrapped with a sheet and is shipped to a liquid crystal display panel maker.

Figure 7:
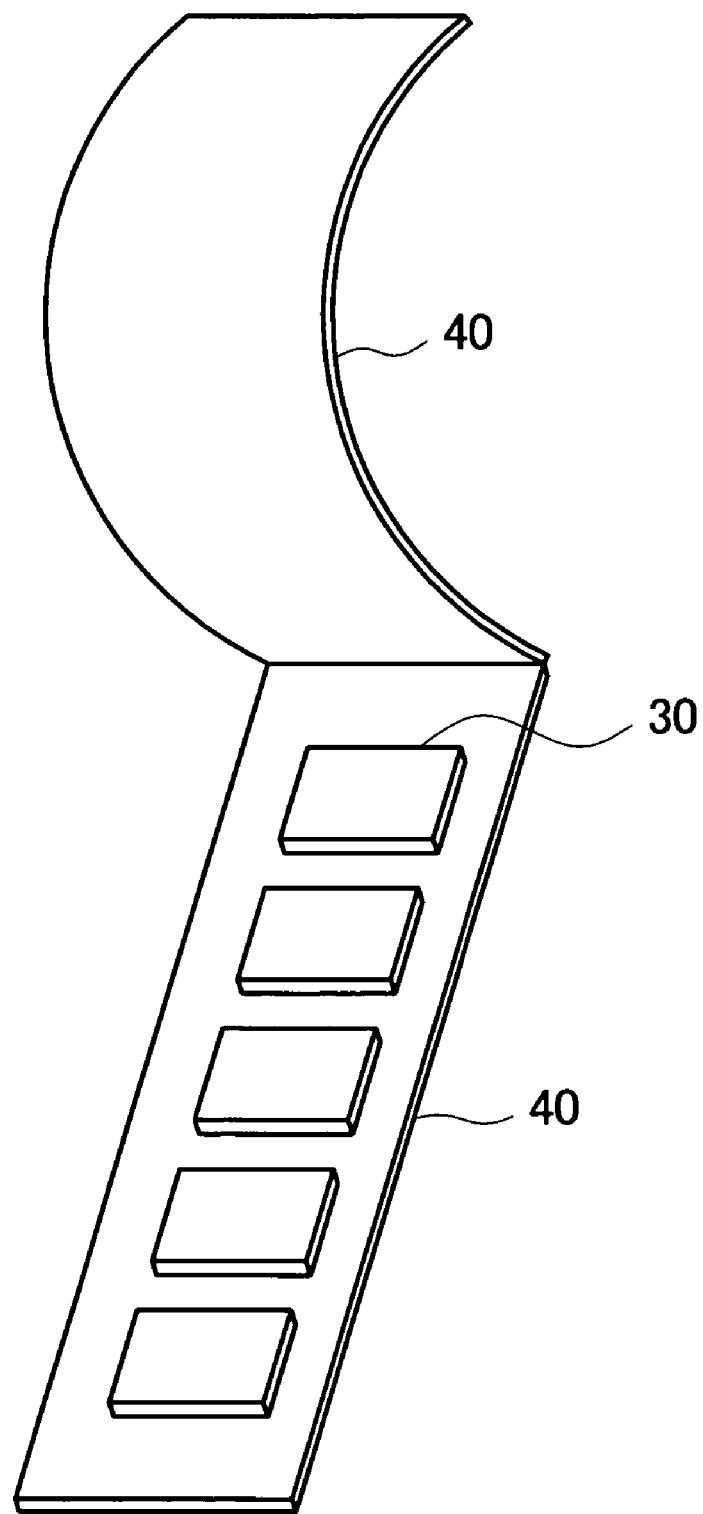
FIG. 7 is a schematic view showing a state that the face plate is wrapped.

FIG. 7 is a schematic view showing a state in which the face plate 30 is wrapped with a wrapping sheet for shipping. Conventionally, a sheet for such wrapping adopts the following constitution. The wrapping sheet is formed of a polyethylene film. An adhesive material is applied to a surface of the polyethylene film, and the face plates 30 are fixed to the polyethylene film using the adhesive material. A thickness of the whole wrapping film 40 is 70 µm, while a thickness of the adhesive material is 10 µm to 20 µm.

After receiving the face plates 30, the liquid crystal display panel maker cleans the face plates 30. When the face plate 30 is fixed to the wrapping film 40 using the adhesive material, as described in the related art, the adhesive material is adhered to the face plate 30. The adhesive material which is adhered to the face plate 30 is peeled off at the time of cleaning the face plate 30 and remains in the cleaning liquid. This adhesive agent is adhered to the face plate 30 again leading to insufficient cleaning. To cope with this insufficient cleaning, in this embodiment, instead of applying the adhesive material to the wrapping film 40, the face plate 30 is fixed to the wrapping film 40 using static electricity generated on the polyethylene film. After fixing the face plate 30 to the wrapping film 40, the face plate 30 is covered with the wrapping sheet 40 thus protecting and fixing the face plate 30.

Embodiment 2

Figure 8A:
FIG. 8A to FIG. 8C are views showing a profile of a face plate of an embodiment 2.
Figure 8B:
Figure 8C:
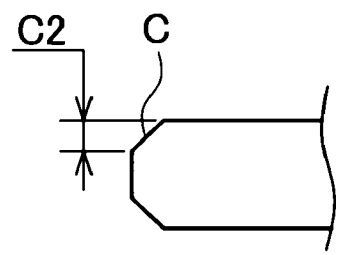

FIG. 8A to FIG. 8C show a shape of a face plate 30 used in an embodiment 2 of the present invention. The constitution of the liquid crystal display device of this embodiment is substantially equal to the constitution of the liquid crystal display device explained in conjunction with FIG. 1 and FIG. 2. In FIG. 8, a point which makes this embodiment different from the embodiment 1 in the shape of the face plate 30 lies in that a rounded portion RC is formed on each corner portions instead of forming the chamfer. The rounded portions RC are formed on the face plate 30 to enhance the strength of the face plate 30 as well as to cope with the peeling-off of the face plate 30.

In this embodiment, instead of the chamfers, the rounded portions are formed on the face plate 30. Since corner portions are not formed in a square shape in this embodiment, the strength of the glass can be further advantageously enhanced. Further, this embodiment can also acquire the advantageous effect that peeling-off of the face plate 30 from the liquid crystal display panel can be prevented in the same manner as the embodiment 1. A size of the rounded portion RC is 0.5 mm in this embodiment. When the size of the rounded portion RC is 0.3 mm or more, it is possible to acquire the advantageous effect attributed to rounding of the corner portion. Further, when the size of the rounded portions RC is excessively increased, the rounded portion RC extends over the corner of the display surface and hence, it is necessary to determine the size of the rounded portion RC by taking a display area into consideration. In general, the size of the rounded portion RC is set to 3 mm or less. However, an upper limit of the size of the rounded portion RC is determined based on the size of an effective display screen and hence, it is not necessary to set an upper limit with respect to strength of the face plate 30 or peeling-off of the face plate 30.

Also in this embodiment, the chamfers C are formed on side portions of the face plate 30. In the same manner as the embodiment 1, the chamfers C are formed on the face plate 30 for enhancing the strength of the face plate 30 and, at the same time, for preventing the generation of white dots in the periphery of the display screen. A size C2 of the chamfer C shown in FIG. 8C is set to 0.15 mm in the same manner as the embodiment 1. The side portion may preferably be chamfered with a cutting size of 0.15 mm or more. However, when the side portion is chamfered with a cutting size of 0.05 mm or more, it is possible to acquire the advantageous effect. On the other hand, in the same manner as the embodiment 1, an upper limit of the cutting size of the chamfer C2 is determined based on the relationship between the plate thickness of the face plate 30 and the display region.

In the same manner as the embodiment 1, the plate thickness of the face plate 30 in this embodiment is set to 0.95 mm. Further, although IG3 (trade name and made by ISHIZUKA GLASS CO., LTD.) is used as a glass material in this embodiment, soda glass may be used as the glass material in the same manner as the embodiment 1. The process flow for manufacturing the face plate 30 of this embodiment is substantially equal to the process flow for manufacturing the face plate 30 of the embodiment 1 explained in conjunction with FIG. 5. Here, the face plate 30 of this embodiment differs from the face plate 30 of the embodiment 1 in profile and hence, this embodiment differs from the first embodiment in polishing of the profile of the face plate 30 in step 4 explained in conjunction with FIG. 5.

Figure 9A:
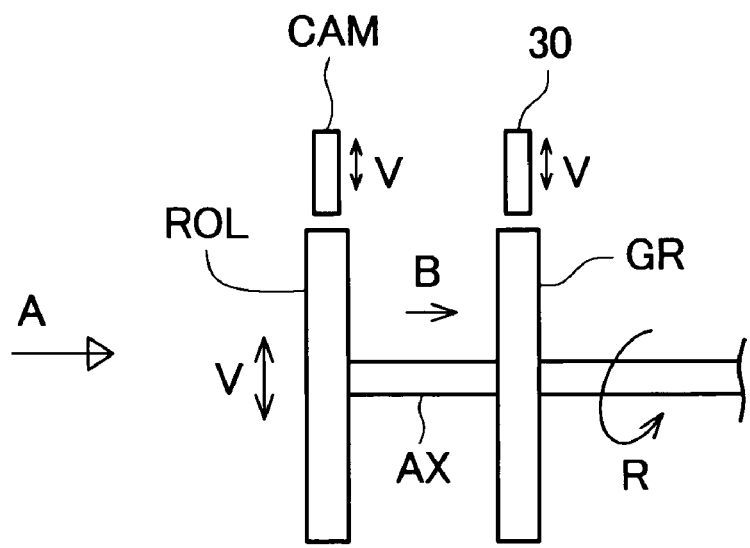
FIG. 9A to FIG. 9C are schematic views showing a profile-polishing machine of the face plate shown in FIG. 8.
Figure 9B:
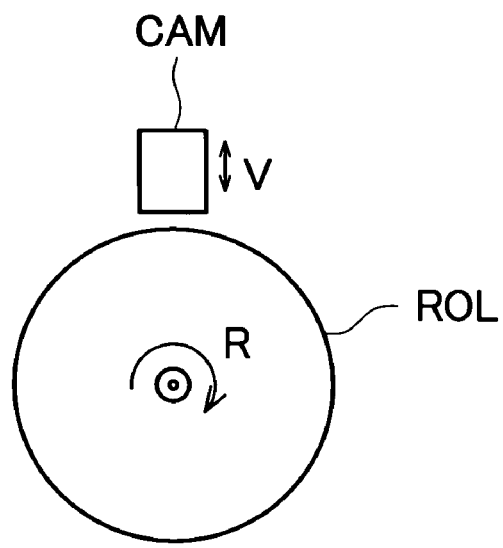
Figure 9C:
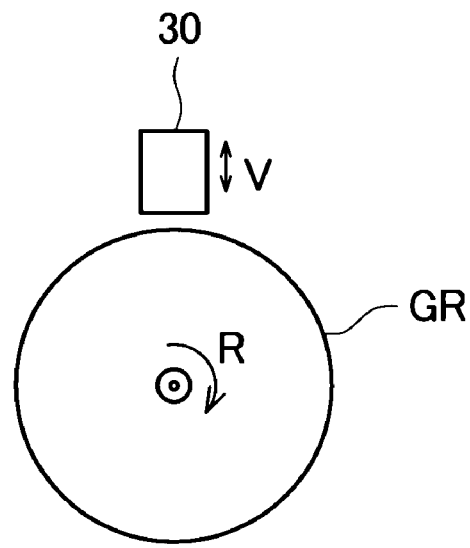

FIG. 9A to FIG. 9C are schematic views showing a polishing machine for accurately forming the profile of the face plate 30 shown in FIG. 8. Also in FIG. 9, this embodiment adopts the substantially same basic constitution as the constitution of the polishing machine shown in FIG. 6. That is, the profile of the face plate 30 is polished by moving a grinder GR along with the movement of a roller ROL which corresponds to a cam CM. FIG. 9A is a side schematic view of the polishing machine, FIG. 9B is a view showing the polishing machine shown in FIG. 9A as viewed in the direction A in FIG. 9A, and FIG. 9C is a view showing the polishing machine shown in FIG. 9A as viewed in the direction B.

In FIG. 9A, FIG. 9B and FIG. 9C, for facilitating the understanding of the drawing, although the cam CM is depicted in a state that the cam CM is in a spaced-apart manner from the roller ROL, the cam CM is in contact with the roller ROL in an actual state. Further, in FIG. 9A, FIG. 9B and FIG. 9C, although the grinder GR is depicted in a state that the grinder GR is spaced-apart from the face plate 30, the grinder GR is in contact with the face plate 30 in an actual state.

When the roller ROL is rotated, a rotary shaft AX is moved tracing the shape of the cam CM. Then, the grinder GR which is mounted coaxially with the roller ROL is also moved in the same manner as the roller ROL. That is, the grinder GR is moved tracing the shape of the cam CM. The face plate 30 is brought into contact with the grinder GR and hence, a profile of the face plate 30 is polished by the rotating grinder GR tracing the shape of the cam CM. The shape of the cam CM becomes a shape similar to a final profile of the face plate 30. By forming a rounded portion R corresponding to a corner portion of the face plate 30 on the corner portion of the cam CM, the rounded portion R of the face plate 30 is formed.

Steps 5 to 10 which follow step 4 in which the profile of the face plate 30 is determined are substantially equal to steps 5 to 10 of the embodiment 1. Step of adhering the face plate 30 produced in the above-mentioned manner to the liquid crystal display panel is substantially equal to the corresponding step explained in conjunction with the embodiment 1. Further, the profile of the face plate 30 of this embodiment is formed smaller than the size of the upper polarizer 14 adhered to the liquid crystal display panel in the same manner as the embodiment 1. In the same manner as the embodiment 1, the short-axis length and the long-axis length of the face plate 30 may preferably be set smaller than the short-axis length and the long-axis length of the upper polarizer 14 by 0.5 mm or more. According to this embodiment, by forming the rounded portion R on the corner portion of the face plate 30, it is possible to increase the strength of the face plate 30 and, at the same time, it is possible to prevent peeling-off of the face plate 30 from the liquid crystal display panel at the corner portions.

What is claimed is:

1. A liquid crystal display device including a liquid crystal display panel which has a TFT substrate on which pixel electrodes and TFTs for controlling signals to the pixel electrodes are arranged in a matrix array and a color filter substrate on which color filters corresponding to the pixel electrodes are formed, wherein an upper polarizer is adhered to the color filter substrate, a face plate made of glass is adhered to the upper polarizer, and the face plate has a profile smaller than a profile of the upper polarizer, and the upper polarizer and the face plate have an approximately rectangular shape, and the face plate is shorter than the upper polarizer by 0.5 mm or more with respect to a short-axis length and a long-axis length.

* * * * *